US009153735B2

(12) United States Patent
Schneider et al.

(10) Patent No.: US 9,153,735 B2
(45) Date of Patent: Oct. 6, 2015

(54) OPTOELECTRONIC SEMICONDUCTOR COMPONENT

(75) Inventors: Markus Schneider, Nittendorf-Schoenhofen (DE); Johann Ramchen, Altdorf (DE); Michael Wittmann, Alteglofsheim (DE)

(73) Assignee: OSRAM OPTO SEMICONDUCTOR GMBH, Regensburg (DE)

( * ) Notice: Subject to any disclaimer, the term of this patent is extended or adjusted under 35 U.S.C. 154(b) by 9 days.

(21) Appl. No.: 13/825,600

(22) PCT Filed: Sep. 21, 2011

(86) PCT No.: PCT/EP2011/066458
§ 371 (c)(1),
(2), (4) Date: Jun. 28, 2013

(87) PCT Pub. No.: WO2012/038483
PCT Pub. Date: Mar. 29, 2012

(65) Prior Publication Data
US 2013/0285084 A1   Oct. 31, 2013

(30) Foreign Application Priority Data

Sep. 22, 2010  (DE) .......................... 10 2010 046 254

(51) Int. Cl.
*H01L 33/08* (2010.01)
*H01L 33/56* (2010.01)
*H01L 23/00* (2006.01)
*H01L 25/075* (2006.01)
(Continued)

(52) U.S. Cl.
CPC ............... *H01L 33/08* (2013.01); *H01L 24/24* (2013.01); *H01L 33/56* (2013.01); *H01L 25/0753* (2013.01); *H01L 25/167* (2013.01); *H01L 33/54* (2013.01); *H01L 33/60* (2013.01); *H01L 33/62* (2013.01); *H01L 2224/48227* (2013.01); *H01L 2224/48471* (2013.01); *H01L 2224/48479* (2013.01); *H01L 2924/12041* (2013.01)

(58) Field of Classification Search
CPC .......... H01L 33/08; H01L 33/48; H01L 21/50
USPC ...................... 257/79, 89, E21.499, E23.031, 257/E25.032, E33.056
See application file for complete search history.

(56) References Cited

U.S. PATENT DOCUMENTS

| | | |
|---|---|---|
| 8,994,047 B2 | 3/2015 | Bogner et al. |
| 2009/0218588 A1 | 9/2009 | Panaccione et al. |

(Continued)

FOREIGN PATENT DOCUMENTS

| | | |
|---|---|---|
| CN | 101681969 A | 3/2010 |
| DE | 10 2006 041 460 A1 | 3/2008 |

(Continued)

*Primary Examiner* — Fernando L Toledo
*Assistant Examiner* — Lawrence-Linh T Nguyen
(74) *Attorney, Agent, or Firm* — Slater & Matsil, L.L.P.

(57) ABSTRACT

An optoelectronic semiconductor component includes a carrier which has an upper side and a lower side opposite to the upper side. At least one radiation-emitting semiconductor device is disposed on the upper side and has a radiation emission surface, through which at least a portion of the electromagnetic radiation, which is generated during operation of the semiconductor device, leaves the semiconductor device. A radiation-absorbing layer is arranged to absorb ambient light, which impinges upon the component, such that an outer surface of the component facing away from the carrier appears black at least in places.

4 Claims, 4 Drawing Sheets

(51) Int. Cl.
  *H01L 25/16* (2006.01)
  *H01L 33/54* (2010.01)
  *H01L 33/60* (2010.01)
  *H01L 33/62* (2010.01)

(56) References Cited

U.S. PATENT DOCUMENTS

2010/0276706 A1* 11/2010 Herrmann ................ 257/89
2012/0285054 A1  11/2012 Roth et al.

FOREIGN PATENT DOCUMENTS

| DE | 10 2007 029 369 A1 | 1/2009 |
| DE | 10 2007 030 129 A1 | 1/2009 |
| DE | 10 2007 044 198 A1 | 3/2009 |
| DE | 10 2007 060 206 A1 | 6/2009 |
| DE | 10 2008 021 402 A1 | 11/2009 |
| EP | 0 374 121 A2 | 6/1990 |
| EP | 2 144 305 A1 | 1/2010 |
| JP | 2006049026 A | 2/2006 |
| JP | 2007109930 A | 4/2007 |
| JP | 2009194026 A | 8/2009 |
| JP | 2010157638 A | 7/2010 |
| KR | 20100028654 A | 3/2010 |
| TW | 200926463 A | 6/2009 |
| WO | 2009003442 A1 | 1/2009 |
| WO | WO 2009/075753 A2 | 6/2009 |
| WO | 2010035206 A1 | 4/2010 |

* cited by examiner

OPTOELECTRONIC SEMICONDUCTOR COMPONENT

This patent application is a national phase filing under section 371 of PCT/EP2011/066458, filed Sep. 21, 2011, which claims the priority of German patent application 10 2010 046 254.3, filed Sep. 22, 2010, each of which is incorporated herein by reference in its entirety.

TECHNICAL FIELD

An optoelectronic semiconductor component is provided.

SUMMARY OF THE INVENTION

Embodiments of the invention provide an optoelectronic semiconductor component which appears black.

In accordance with at least one embodiment of the optoelectronic semiconductor component, it comprises a carrier which has a upper side and a lower side opposite to the upper side. The carrier can be a printed circuit board or a metal carrier frame (lead frame). It is likewise feasible for the carrier to be formed in a flexible manner and, e.g., as a foil. The carrier can be formed with an electrically conductive material, e.g., a metal and/or an electrically insulating material, e.g., a thermosetting and/or thermoplastic material and/or a ceramic material.

Formed on the upper side and the lower side in each case is a surface which is formed by a part of the outer surfaces of the carrier. The surface on the lower side is the part of the outer surfaces of the carrier which faces towards a contact carrier—e.g., a printed circuit board—when the carrier is in the assembled state. For example, the surface on the lower side of the carrier is a mounting surface which can be used for mounting of the optoelectronic semiconductor component.

In accordance with at least one embodiment, the optoelectronic semiconductor component comprises at least one radiation-emitting semiconductor device which is disposed on the upper side and has a radiation emission surface, by means of which at least a portion of the electromagnetic radiation generated during operation of the semiconductor device leaves the semiconductor device. The radiation-emitting semiconductor device can be a radiation-emitting semiconductor chip. For example, the semiconductor chip is a luminescence diode chip. The luminescence diode chip can be a light-emitting diode chip or a laser diode chip.

In accordance with at least one embodiment, the optoelectronic semiconductor component comprises a radiation-absorbing layer which is arranged to absorb ambient light, which impinges upon the component, such that an outer surface of the component facing away from the carrier appears black at least in places. For example, radiation-absorbing particles or fibers, such as, e.g., carbon black particles or other radiation-absorbing particles, are introduced for this purpose into the radiation-absorbing layer. For example, the outer surface of the component facing away from the carrier is formed at least in places by the radiation-absorbing layer itself.

In accordance with at least one embodiment, the radiation-absorbing layer completely encircles the radiation-emitting semiconductor device in a lateral direction and is in direct contact, at least in places, with lateral surfaces of the radiation-emitting semiconductor device. In the "lateral direction" means in this case a direction in parallel with the main extension direction of the carrier. For example, in a plan view of the outer surface of the semiconductor component, the outer surface appears black except for the radiation emission surface.

In accordance with at least one embodiment, the radiation emission surface is free from the radiation-absorbing layer. "Free" means that the radiation emission surface is not covered by the radiation-absorbing layer nor is the radiation-absorbing layer disposed downstream of the semiconductor device, e.g., along a radiation emission path of the radiation-emitting semiconductor device. It is at most possible that, as a result of the production process, the radiation emission surface will still have material residues of the radiation-absorbing layer located thereon which, however, cover at the most 10%, preferably at the most 5%, of the radiation emission surface.

In accordance with at least one embodiment, the optoelectronic semiconductor component comprises a carrier which has an upper side and a lower side opposite to the upper side. Disposed on the upper side is at least one radiation-emitting semiconductor device having a radiation emission surface, by means of which at least a portion of the electromagnetic radiation generated during operation of the semiconductor device leaves the semiconductor device. Furthermore, the optoelectronic semiconductor component comprises a radiation-absorbing layer which is arranged to absorb ambient light, which impinges upon the component, such that an outer surface of the component facing away from the carrier appears black at least in places. The radiation-absorbing layer completely encircles the radiation-emitting semiconductor device in a lateral direction and is in direct contact, at least in places, with lateral surfaces of the radiation-emitting semiconductor device. Furthermore, the radiation emission surface is free from the radiation-absorbing layer.

The optoelectronic semiconductor component described in this case is characterized by a high brightness contrast between the radiation emission surface and the remainder of the outer surface of the component and is therefore particularly suitable for use, e.g., in display devices. Furthermore, disturbing back-reflections of electromagnetic radiation from, e.g., optics built into the component back in the direction of the radiation-emitting semiconductor device of the component can be avoided.

In accordance with at least one embodiment, the outer surface of the semiconductor component is formed at least in places by the outer surface of the radiation-absorbing layer. The radiation-absorbing layer defines the semiconductor component outwards and in particular is not disposed in a cavity of a housing and forms in particular itself a part of the housing. The lateral surfaces of the radiation-absorbing layer can terminate flush with the lateral surfaces of the carrier, wherein the radiation-absorbing layer can also form the surface of the semiconductor component facing away from the carrier.

In accordance with at least one embodiment, the radiation-absorbing layer is a filler which, at least in places, encloses the lateral surfaces of the semiconductor component in a positive-locking manner. In this regard, "positive-locking" means that neither a gap nor an interruption is formed between the radiation-absorbing layer and the lateral surfaces of the semiconductor device. Preferably, the radiation-absorbing layer and the lateral surfaces are in direct contact with one another. For example, the radiation-absorbing layer is applied to the carrier by means of casting of the semiconductor device and subsequent hardening. "At least in places" can mean that the radiation-absorbing layer encloses the lateral surfaces of the semiconductor device in a positive-locking manner only up to a certain fill height. As a consequence, it is possible for the semiconductor device itself to be completely concealed on its lateral surfaces by the radiation-absorbing layer. The lateral surfaces of the semiconductor device are thus covered completely or partially up to a specifiable height by the radiation-absorbing layer.

In accordance with at least one embodiment, the radiation-absorbing layer does not protrude beyond the semiconductor device in a vertical direction. "In a vertical direction" means a direction perpendicular to the lateral direction. For example, the radiation-absorbing layer terminates flush with the radiation emission surface of the semiconductor device in a lateral direction. For example, the outer surface of the semiconductor device is then formed by means of an outer surface of the radiation-absorbing layer facing away from the carrier, and the radiation emission surface of the semiconductor device. For example, the radiation-emitting semiconductor device is formed with a radiation-emitting semiconductor chip and a conversion element which is disposed downstream of the semiconductor chip in its main radiation direction. The conversion element can be used for the at least partial conversion of electromagnetic radiation, which is emitted by the radiation-emitting semiconductor chip, into electromagnetic radiation of a different wavelength range. In this case, the radiation emission surface can be formed by means of an outer surface of the conversion element facing away from the carrier.

In accordance with at least one embodiment, a radiation-reflecting layer which covers the lateral surfaces of the semiconductor device in places is disposed in a vertical direction between the carrier and the radiation-absorbing layer. "Radiation-reflecting" means in particular that the radiation-reflecting layer is at least 80%, preferably more than 90%, reflective for light impinging upon it. For example, the radiation-reflecting layer appears white to an external observer of the radiation-reflecting layer. For example, radiation-reflecting particles which are formed, e.g., with at least one of the materials $TiO_2$, $BaSO_4$, ZnO or $Al_xO_y$ or contain at least one of the said materials are introduced for this purpose into the radiation-reflecting layer. Preferably, in a plan view of the outer surface of the semiconductor component the reflective layer is completely concealed by the radiation-absorbing layer. In other words, an external observer is no longer able to recognize and/or discern the radiation-reflecting layer in a plan view of the outer surface of the semiconductor component. In an advantageous manner, electromagnetic radiation which is generated within the semiconductor device and exits via the lateral surfaces is at least partially reflected back into the semiconductor device by the radiation-reflecting layer and is directed, e.g., in the direction of the radiation emission surface. Therefore, the largest possible proportion of electromagnetic radiation generated within the semiconductor device is reflected in the direction of the radiation emission surface and can then couple out of the semiconductor component via the radiation emission surface of the semiconductor device. In other words, the reflective properties of the radiation-reflecting layer are combined with the contrast-generating properties of the radiation-absorbing layer in a semiconductor component, in order, on the one hand, to be able to couple out as much electromagnetic radiation as possible from the component and, on the other hand, to increase the contrast.

In accordance with at least one embodiment, at least 20% of the electromagnetic radiation, which is emitted in total by the semiconductor device, exits the semiconductor device through the lateral surfaces and is reflected at least partially by the radiation-reflecting layer. The semiconductor device is therefore a so-called volume emitter, from which electromagnetic radiation generated by it exits not only via its main surface facing away from the carrier, but also at least partially via its lateral surfaces. Surprisingly, it has been shown that, even though the semiconductor device also emits electromagnetic radiation via its lateral surfaces, radiation coupling-out efficiency can be increased in a particularly effective manner by means of the radiation-reflecting layer described in this case. "Radiation coupling-out efficiency" is the ratio of luminous energy, which is coupled out from the semiconductor component via its radiation emission surface, to luminous energy generated primarily within the semiconductor device.

In accordance with at least one embodiment, a radiation-permeable layer is applied, at least in places, to an outer surface of the radiation-absorbing layer facing away from the carrier and/or to the radiation emission surface. In this regard, "radiation-permeable" means that the layer is at least 80%, preferably more than 90%, permeable for electromagnetic radiation impinging upon it. In this case, the outer surface of the semiconductor component can be formed, at least in places, by means of an outer surface of the radiation-permeable layer facing away from the carrier. In a plan view of the outer surface of the semiconductor component, e.g., only the radiation-absorbing layer and/or the radiation emission surface of the semiconductor device are visible from the outside. In other words, the outer surface of the radiation-permeable layer appears to the external observer to be black, at least in places, by reason of the underlying, radiation-absorbing layer. For example, the radiation-permeable layer is formed with a silicone which is at least partially oxidized (even glazing). For example, the outer surface of the radiation-permeable layer is at least partially oxidized. In an advantageous manner, the at least partial oxidizing of the radiation-permeable layer can reduce adhesiveness of the outer surface of the radiation-permeable layer. For example, undesired foreign particles, such as, e.g., dust particles, can thus be prevented from adhering and/or remaining stuck to the outer surface of the radiation-permeable layer.

In accordance with at least one embodiment, the carrier of the optoelectronic semiconductor component has at least one connection point. For example, the connection point forms, in places, the surface on the upper side of the carrier.

In accordance with at least one embodiment, the optoelectronic semiconductor component comprises at least one layer opening which is disposed over at least one of the connection points of the carrier and passes completely through the radiation-absorbing layer and extends from an upper side of the radiation-absorbing layer, facing away from the carrier, in the direction of the lower side of the carrier. For example, the layer opening has at least one lateral surface. The at least one lateral surface of the opening is formed, at least in places, by the radiation-absorbing layer. In this regard, "over" means that the connection point and the layer opening overlap, at least in places, in a vertical direction. At places where the connection point is overlapped by the layer opening, the connection point is, at least in places, free from the material of the radiation-absorbing layer. For example, the connection point can be electrically contacted from the outside via the layer opening in the radiation-absorbing layer.

In accordance with at least one embodiment, the layer opening is disposed spaced apart in a lateral direction with respect to the semiconductor device. That is to say, the layer opening is disposed at the side of the semiconductor device and extends, e.g., perpendicularly or substantially perpendicularly with respect to the lateral direction.

In accordance with at least one embodiment, an electrically conductive material is disposed, at least in places, in the layer opening. The electrically conductive material is formed, e.g., with a metal or an electrically conductive adhesive. For example, the electrically conductive material completely fills the layer opening.

In accordance with at least one embodiment, the electrically conductive material is disposed, at least in places, on the outer surface of the component facing away from the carrier. If, e.g., the outer surface of the radiation-absorbing layer, facing away from the carrier, itself forms the outer surface of the component at least in places, the electrically conductive material can be disposed, at least in places, on the outer surface of the radiation-absorbing layer and can be in direct contact therewith at these locations. The same applies in the case where the outer surface of the radiation-permeable layer facing away from the carrier forms, at least in places, the outer surface of the component.

In accordance with at least one embodiment, the electrically conductive material connects the connection point to the semiconductor device in an electrically conductive manner. That is to say, the electrically conductive material connects the semiconductor device to the layer opening and extends in a lateral direction between the semiconductor device and the layer opening at least in places on the outer surface of the component.

In accordance with at least one embodiment, at least one conductive connection is established, by means of an interlayer connection, between the connection point and a further connection point on the upper side of the carrier with contact surfaces on the lower side of the carrier opposite to the upper side. The interlayer connection extends through the carrier and is laterally surrounded by the carrier. By means of the contact surfaces on the lower side of the carrier, the optoelectronic semiconductor component can, for example, be mounted by means of surface mounting technology (also referred to as SMT).

In accordance with at least one embodiment, the layer opening also passes completely through the radiation-reflecting layer and/or the radiation-permeable layer. In this case, the at least one lateral surface of the layer opening is additionally formed, in places, by means of the radiation-absorbing layer or the radiation-reflecting layer.

In accordance with at least one embodiment, the optoelectronic semiconductor component comprises at least two radiation-emitting semiconductor devices which are disposed next to one another on the upper side of the carrier in a lateral direction, wherein at least two of the radiation-emitting semiconductor devices emit light of a different color. For example, the optoelectronic semiconductor component comprises a radiation-emitting semiconductor device which emits blue light and one which emits yellow light. Likewise, depending upon the illumination requirements applied to the optoelectronic semiconductor component, any other combinations of radiation-emitting semiconductor components are feasible which can emit light of different colors. In an advantageous manner, semiconductor components which emit various colors can be disposed in a variable arrangement with respect to one another in a space-saving and compact manner on a common carrier.

In accordance with at least one embodiment, a bond wire contacting of the semiconductor device is covered at least in places by the radiation-absorbing layer. The bond wire contacting electrically connects the connection point to the semiconductor device, e.g., by means of a bond wire. For example, the bond wire contacting is completely covered by the radiation-absorbing layer. In other words, the bond wire contacting then extends completely within the radiation-absorbing layer. In this case, the bond wire of the bond wire contacting does not protrude from the semiconductor device.

In accordance with at least one embodiment, the optoelectronic semiconductor component comprises at least one electronic device which is disposed on the upper side of the carrier and is completely covered by the radiation-absorbing layer. In other words, an external observer is no longer able to recognize the electronic device in a plan view of the outer surface of the semiconductor component. For example, the electronic device is electrically contacted in the same manner as the semiconductor device. That is to say, the electronic device can likewise be contacted via a bond wire contacting and/or via a layer opening which is introduced into the radiation-absorbing layer and in which, at least in places, an electrically conductive material is disposed. For example, the electronic device is or contains a protective circuit to prevent damage caused by electrostatic charge (also referred to as ESD-protective circuit).

In accordance with at least one embodiment, the electrically conductive material directly adjoins the radiation-absorbing layer in places. For example, the electrically conductive material thereby extends in places on the outer surface of the radiation-absorbing layer facing away from the carrier and partially covers it at this location. In particular, it is thereby possible for the electrically conductive material to be formed with a radiation-permeable material, e.g., a TCO (Transparent Conductive Oxide). Radiation-permeable materials include, inter alia, ITO or ZNO. By reason of the fact that a radiation-permeable material is used for the electrically conductive material, the radiation-absorbing effect of the radiation-absorbing layer is not reduced.

In accordance with at least one embodiment, the electrically conductive material is radiation-permeable, in particular see-through and transparent.

BRIEF DESCRIPTION OF THE DRAWINGS

The optoelectronic semiconductor component described in this case will be explained in greater detail hereinafter with reference to exemplified embodiments and the associated figures.

Elements which are identical, of identical type or act identically are provided with the same reference symbols in the figures. The figures and the size relationships of the elements illustrated in the figures among one another should not be regarded as true to scale. Moreover, individual elements may be illustrated with an exaggerated size in order to allow better illustration and/or in order to afford a better understanding.

DETAILED DESCRIPTION OF ILLUSTRATIVE EMBODIMENTS

Figure 1A:
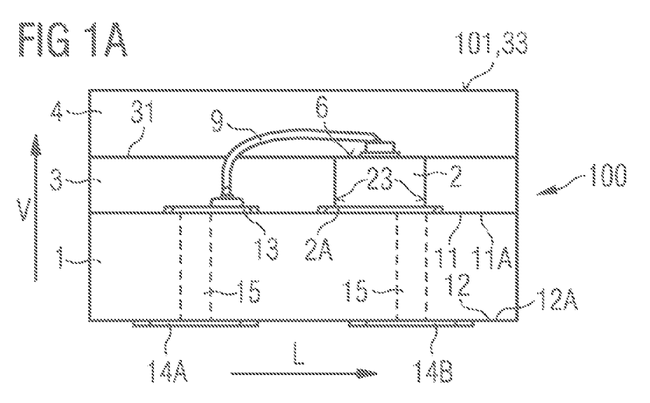
FIGS. 1A, 1B, 1C, 1D, 2A, 2B, 2C, 2D, 2E, 3A, 3B, 3C, 3D, 4A and 4B show schematic views of various exemplified embodiments of an optoelectronic semiconductor component described in this case.

FIG. 1A shows a schematic sectional illustration of an exemplified embodiment of an optoelectronic semiconductor component 100 described in this case. A carrier 1 of the semiconductor component 100 has an upper side 11 and a lower side 12 opposite to the upper side 11. For example, the carrier 1 is formed with a synthetic material and/or a ceramic material. Furthermore, the carrier 1 has connection points 13 on its upper side 11. Radiation-emitting semiconductor devices 2 each having one of two mutually opposite main surfaces of a semiconductor device 2 are applied in the form of a row in a transverse direction L1 (see FIGS. 1B and 1C) to connection points 2A of the carrier 1 which are disposed in a lateral direction L in each case next to the connection points 13. The transverse direction L1 thereby extends in parallel with a main extension direction of the carrier 1 and transversely with respect to the lateral direction L. Each radiation-emitting semiconductor device 2 is electrically contacted by means of a bond wire contacting 9 to a connection point 13 which is allocated to the radiation-emitting semiconductor device 2. Furthermore, the carrier 1 has on its lower side 12 contact surfaces 14A and 14B which are disposed next to one another in a lateral direction L. An electrically conductive connection between the contact surfaces 14A, 14B and the connection points 13, 2A on the upper side 11 of the carrier 1 is established by means of interlayer connections 15. In other words, the interlayer connection 15 extends, starting from the upper side 11 of the carrier 1, in a continuous manner in the direction of the lower side 12 of the carrier 1.

The contact surface 14A thereby serves to electrically contact a connection point 13 which is allocated thereto in each case, and the contact surface 14B serves to electrically contact a connection point 2A which is allocated thereto in each case. If the carrier 1 is applied with its contact surfaces 14A, 14B to a contact carrier, the optoelectronic semiconductor component 100 can be electrically contacted via the contact surfaces 14A, 14B. The optoelectronic semiconductor component 100 is then surface-mountable.

Furthermore, each radiation-emitting semiconductor device 2 has a radiation emission surface 6, through which at least a portion of the electromagnetic radiation, which is generated during operation of the radiation-emitting semiconductor device 2, leaves the semiconductor device 2. The radiation emission surface 6 is the main surface of the radiation-emitting semiconductor device 2 facing away from the carrier 1. Lateral surfaces 23 of the radiation-emitting semiconductor device 2 connect the two main surfaces to one another and extend transversely or substantially transversely with respect to the two main surfaces.

Furthermore, the optoelectronic semiconductor component 100 comprises a radiation-absorbing layer 3 which covers the lateral surfaces 23 of the semiconductor device 2 completely and in a positive-locking manner. In the present case, the radiation-absorbing layer 3 is a filler which is applied to a surface 11A on the upper side 11 of the carrier 1, e.g., by means of casting of the semiconductor device 2. The radiation emission surface 6 is thereby free from the radiation-absorbing layer 3, wherein the radiation-absorbing layer 3 completely encircles the radiation-emitting semiconductor device 2 in a lateral direction L. The radiation-absorbing layer 3 can be formed with a matrix material, into which radiation-absorbing particles, e.g., carbon black particles, are introduced. The radiation-absorbing layer thus appears black. For example, the matrix material is a silicone, an epoxide or a mixture of silicone and epoxide.

Furthermore, the radiation-absorbing layer 3 does not protrude beyond the semiconductor device 2 in a vertical direction V. In other words, the radiation-absorbing layer 3 terminates flush with the radiation emission surface 6 of the semiconductor device 2 in a lateral direction L.

A radiation-permeable layer 4 is applied completely to an outer surface 31 of the radiation-absorbing layer 3 facing away from the carrier 1, and to the radiation emission surface 6. For example, the radiation-permeable layer 4 is formed with a matrix material such as a silicone, an epoxide or a mixture of silicone and epoxide. An outer surface 101 of the optoelectronic semiconductor component 100 is formed completely by an outer surface 33 of the radiation-permeable layer 4 facing away from the carrier 1.

It is also apparent from FIG. 1A that the bond wire contacting 9 extends completely within the radiation-absorbing layer 3 and the radiation-permeable layer 4. In other words, the bond wire contacting 9 does not protrude from the optoelectronic semiconductor component 100. This type of semiconductor component 100 is thus particularly compact and easy to handle.

Figure 1B:
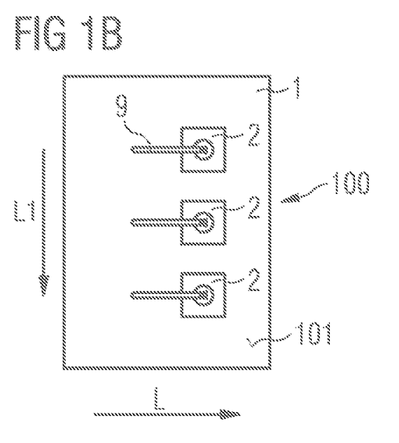

FIG. 1B shows the semiconductor component 100, which is described in FIG. 1A, in a schematic plan view of the outer surface 101 of the semiconductor component 100. The three radiation-emitting semiconductor devices 2 are shown which in the present case are disposed in a row. Each of the radiation-emitting semiconductor devices 2 emits light of a different color. For example, one of the radiation-emitting semiconductor devices 2 emits red light, another emits green light and a further one emits blue light.

Figure 1C:
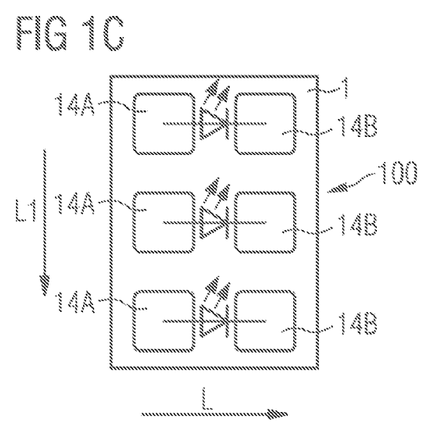

FIG. 1C shows a schematic diagram of the semiconductor component 100 described in FIGS. 1A and 1B. It is apparent that the individual, radiation-emitting semiconductor devices 2 are each separately contacted and can be controlled separately from one another via the connection point 13 which is allocated thereto. In other words, current and/or an operating voltage can be impressed in each case at a specifiable level into each radiation-emitting semiconductor device 2 separately from the remaining radiation-emitting semiconductor devices 2.

Figure 1D:
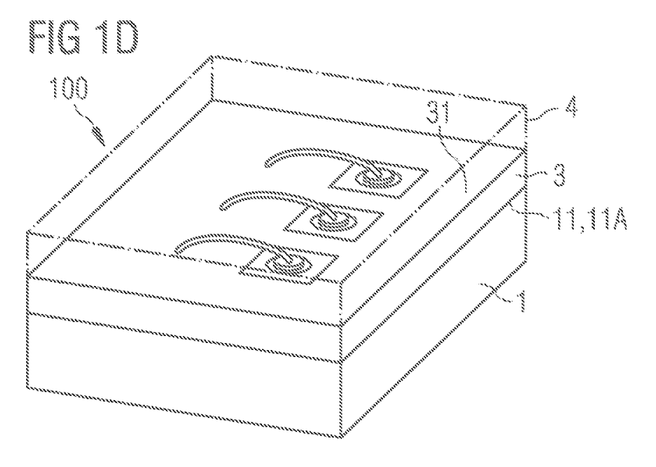

FIG. 1D shows a schematic, perspective view of the optoelectronic semiconductor component 100 described in FIGS. 1A to 1C. The carrier 1 and the radiation-absorbing layer 3 which is applied to the surface 11A on the upper side 11 of the carrier 1 are shown again. FIG. 1D also shows the radiation-permeable layer 4 which is applied completely to the outer surface 31 of the radiation-absorbing layer 3 and the radiation emission surface 6 of the semiconductor components 2.

FIGS. 2A to 2E show a schematic view of a further exemplified embodiment of an optoelectronic semiconductor component 100 described in this case.

Figure 2A:
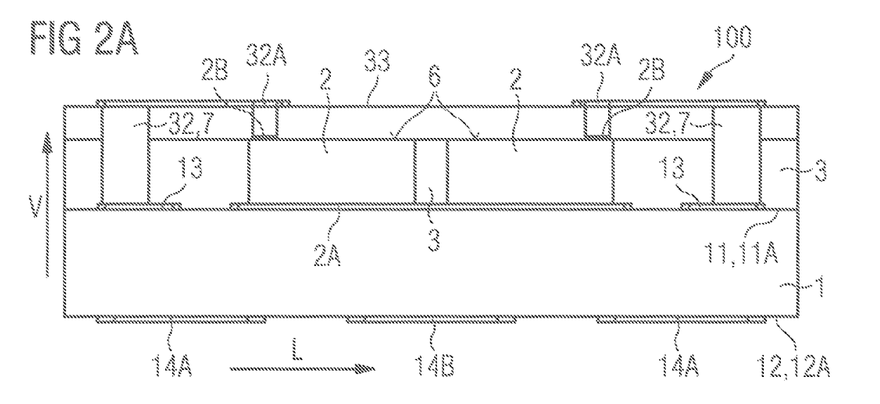

FIG. 2A shows a schematic sectional illustration of a further exemplified embodiment of an optoelectronic semiconductor component 100 described in this case. In the case of the exemplified embodiment illustrated in FIGS. 2A to 2E a bond wire contacting 9 which is illustrated in FIGS. 1A to 1D is omitted. Instead, contacting of the radiation-emitting semiconductor devices 2 is effected as follows.

Disposed in a vertical direction V above the connection points 13 of the carrier 1 is in each case a layer opening 32 which extends from the outer surface 33 of the radiation-permeable layer 4 facing away from the carrier 1 in the direction of the lower side 12 of the carrier 1 completely through the radiation-permeable layer 4 as well as the radiation-absorbing layer 3.

The layer openings 32 are thereby each disposed in a lateral direction L spaced apart from the radiation-emitting semiconductor devices 2 which are allocated thereto. Disposed in each of the layer openings 32 is an electrically conductive material 7 which completely fills the layer openings 32. The electrically conductive material 7 extends starting from the layer openings 32 on the outer surface 101 of the semiconductor component 100 in the direction of the semiconductor device 2 which is allocated to a layer opening 32 in each case. The electrically conductive material 7 electrically contacts the radiation-emitting semiconductor devices 2 via further layer openings 32A which are introduced into the radiation permeable layer 4 in a vertical direction V via contact surfaces 2B of the semiconductor devices 2. In other words, the electrically conductive material 7 connects the connection points 13 in an electrically conductive manner to the semiconductor devices 2 which are allocated thereto. The electrically conductive material 7 is thereby disposed directly and continuously on the outer surface 101 in a lateral direction L between the connection points 13 and the radiation-emitting semiconductor devices 2 which are allocated thereto. In an advantageous manner, the contacting of the semiconductor devices 2 which is described in this case ensures that a minimum spacing is achieved between semiconductor devices 2 which are disposed adjacently in a lateral direction L. This leads to a compact and space-saving optoelectronic semiconductor component 100.

Figure 2B:
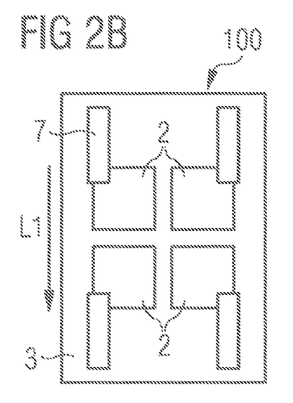

FIG. 2B illustrates, in a schematic plan view of the outer surface 101, the semiconductor component 100 described in FIG. 2A. The semiconductor component 100 comprises a total of four radiation-emitting semiconductor devices 2. It is also apparent from FIG. 2B that the semiconductor devices 2 are disposed in the form of a 2×2 matrix, that is to say in the form of lines and columns, wherein the matrix comprises in the present case two semiconductor devices 2, which emit green light, one semiconductor device 2, which emits red light, and one semiconductor device which emits blue light. The two semiconductor devices 2 which emit green light are diagonally opposite to one another (also referred to as a Bayer pattern). Any other arrangements of the semiconductor devices 2 are also possible. It is feasible, as illustrated in FIGS. 1A to 1D, to provide a linear or triangular arrangement (if there are three semiconductor devices 2). In all of the embodiments described in this case, it is also possible to use semiconductor devices 2 which all emit the same color.

Figure 2C:
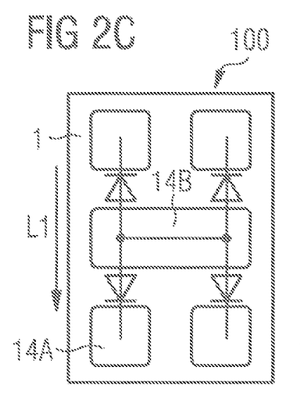
Figure 2D:
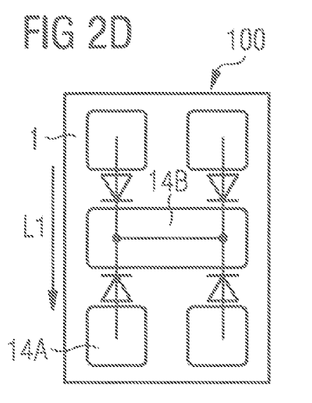
Figure 2E:
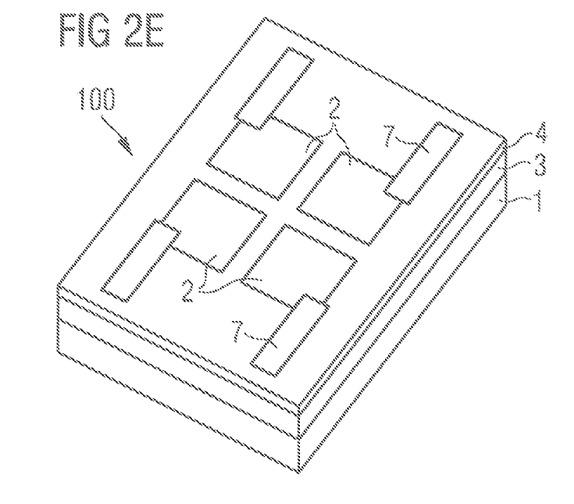

FIGS. 2C and 2D show two different schematic diagrams of the optoelectronic semiconductor component 100 illustrated in FIGS. 2A and 2B. It can be seen that the semiconductor component 100 comprises a single contact surface 14B and contact surfaces 14A which are allocated to a semiconductor device 2 in each case, i.e., in the present case, a total of four contact surfaces 14A are provided. In other words, the one single contact surface 14B forms a first electrical contact for all radiation-emitting semiconductor devices 2 and the four contact surfaces 14A form the respective other electrical contacts for the radiation-emitting semiconductor devices 2. In FIG. 2C, the contact surface 14B is connected in such a manner that with external electrical contacting it forms a common cathode, whereas in FIG. 2D with external contacting the contact surface 14B forms a common anode for all radiation-emitting semiconductor devices 2. That is to say that in contrast to the semiconductor component 100 shown in FIGS. 1A to 1D, the radiation-emitting semiconductor devices 2 are electrically contacted and controllable all together via the one common contact surface 14B, in the form of either an anode or a cathode. FIG. 2E shows, in a schematic, perspective plan view, the optoelectronic semiconductor component 100 described in FIGS. 2A to 2D. What is shown are again the optoelectronic semiconductor devices 2 which are disposed in the manner of a matrix and are contacted in an electrically conductive manner in each case via the electrically conductive material 7.

FIGS. 3A to 3D illustrate schematic views of a further exemplified embodiment of an optoelectronic semiconductor component 100 described in this case.

Figure 3A:
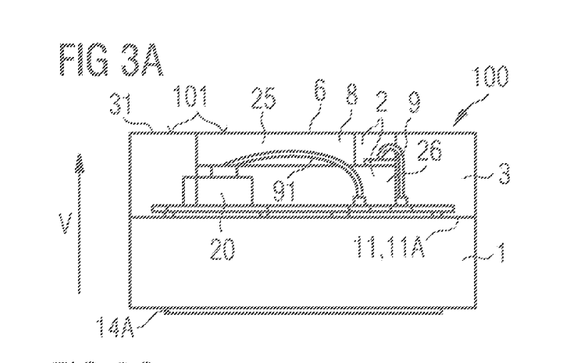

FIG. 3A shows a schematic sectional illustration of how an optoelectronic semiconductor device 2 is applied to the surface 11A on the upper side 11 of the carrier 1. In the present case, the optoelectronic semiconductor device 2 is formed with a radiation-emitting semiconductor chip 26, wherein a conversion element 25 is applied to an outer surface of the radiation-emitting semiconductor chip 26 facing away from the carrier 1. The conversion element 25 serves to at least partially convert electromagnetic radiation, which is emitted by the radiation-emitting semiconductor chip 26, into electromagnetic radiation of a different wavelength range. The lateral surfaces 23 of the radiation-emitting semiconductor device 2 are formed by lateral surfaces of the radiation-emitting semiconductor chip 26 and lateral surfaces of the conversion element 25. The radiation emission surface 6 of the semiconductor device 2 is therefore an outer surface of the conversion element 25 facing away from the carrier 1.

In contrast to the optoelectronic semiconductor component 100 illustrated in FIGS. 1A to 1D, the radiation-permeable layer 4 is omitted. In other words, the outer surface 101 of the optoelectronic semiconductor component 100 is formed completely by the outer surface 31 of the radiation-absorbing layer 3 and the radiation emission surface 6. The radiation-absorbing layer 3 does not protrude beyond the semiconductor device 2 in a vertical direction V and terminates flush with the radiation emission surface 6 of the semiconductor device 2 in a lateral direction L. Furthermore, the bond wire contacting 9 extends completely within the radiation-absorbing layer 3 and is surrounded thereby.

Figure 3B:
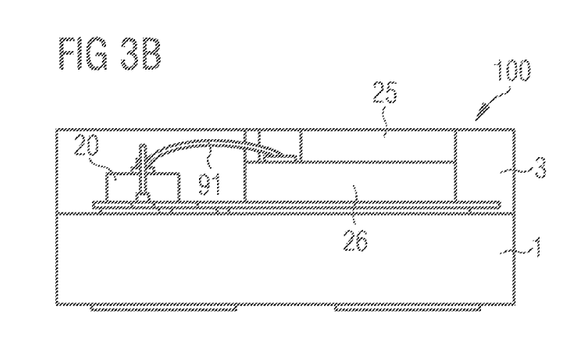

FIG. 3B illustrates, in a further schematic sectional illustration in the lateral direction L, the optoelectronic semiconductor component 100 shown in FIG. 3A. It is apparent that an electronic device 20 is applied to the surface 11A on the upper side 11 and is electrically connected, e.g., in antiparallel fashion to the radiation-emitting semiconductor chip 26 by means of a further bond wire contacting 91. The electronic device 20 and the further bond wire contacting 91 are completely covered by the radiation-absorbing layer 3. In other words, the electronic device 20 is no longer visible from the outside.

Figure 3C:
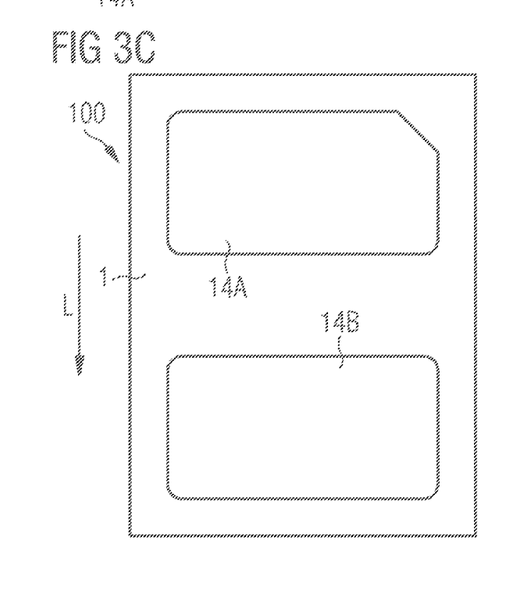

FIG. 3C shows, in a schematic bottom view of the surface 12A, the optoelectronic semiconductor component 100, which is described in FIGS. 3A and 3B, with its contact surfaces 14A and 14B.

Figure 3D:
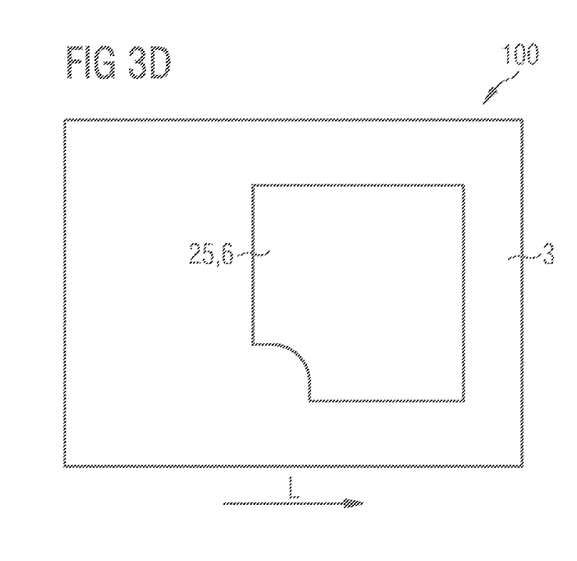

FIG. 3D also shows, in a schematic plan view of the outer surface 101 of the optoelectronic semiconductor component 100, that except for the radiation emission surface 6, the remainder of the outer surface 101 appears black. In other words, in this case the outer surface 101 of the semiconductor component 100 appears to be colored only at certain locations of the conversion element 25, since the conversion element 25 can re-emit colored light when it is irradiated with ambient light.

Figure 4A:
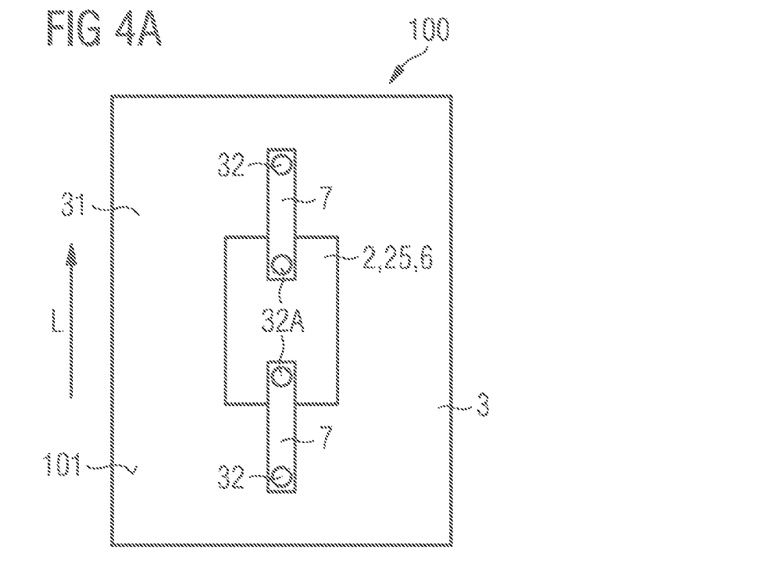
Figure 4B:
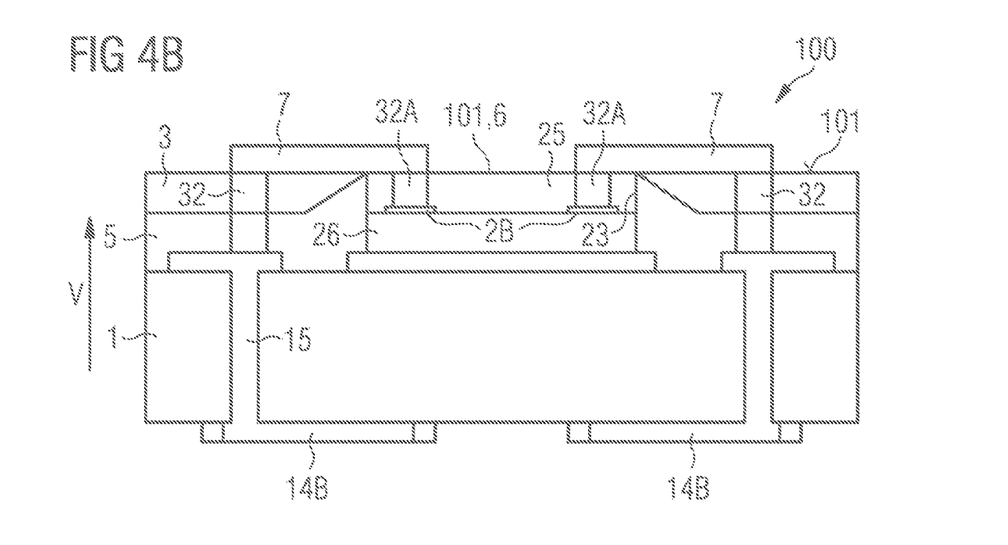

FIGS. 4A and 4B illustrate schematic views of a further exemplified embodiment of an optoelectronic semiconductor component 100 described in this case.

It is apparent from FIG. 4A in the schematic plan view—illustrated in this case—of the outer surface 101 of the semiconductor component 100 that the outer surface 101 is formed by the outer surface 31 of the radiation-absorbing layer 3 and the radiation emission surface 6 of the radiation-emitting semiconductor device 2. In turn, the radiation emission surface 6 is formed by the outer surface of the conversion element 25 facing away from the carrier 1. However, in contrast to the previously illustrated exemplified embodiments, instead of the bond wire contacting 9 or a single layer opening 32 allocated to a radiation-emitting semiconductor device 2, the radiation-emitting semiconductor device 2 is electrically contacted by means of two further layer openings 32A which are introduced into the radiation-absorbing layer 3. For the purpose of electrical contacting, the radiation-emitting semiconductor device 2 has two contact surfaces 2B, via which the two further layer openings 32A are introduced into the conversion element 25. Furthermore, an electrically conductive connection is established in each case between a layer opening 32 and a further layer opening 32A, which is allocated to the layer opening 32, by means of the electrically conductive material 7. The contacting of the radiation-emitting semiconductor device 2 proceeds, with the exception of the difference illustrated above, in the same manner as in the exemplified embodiment illustrated in FIGS. 2A to 2E.

It is apparent from FIG. 4B in the schematic sectional view—illustrated in this case—of the optoelectronic semiconductor component 100 that a radiation-reflecting layer 5 is disposed in a vertical direction V between the radiation-absorbing layer 3 and the carrier 1. The radiation-reflecting layer 5 covers the lateral surfaces 23 of the semiconductor device 2 in places. The parts of the lateral surfaces 23 which are not covered by the radiation-reflecting layer 5 are covered by the radiation-absorbing layer 3. In the present case, at least 20% of the electromagnetic radiation, which is emitted in total by the radiation-emitting semiconductor device 2, exits the radiation-emitting semiconductor device 2 through the lateral surfaces 23 and is reflected at least partially back into the semiconductor device 2 by the radiation-reflecting layer 5 and is directed, e.g., in the direction of the radiation emission surface 6. In other words, the semiconductor device 2 illustrated in FIGS. 4A and 4B is a volume emitter.

The invention is not limited by the descriptions using the exemplified embodiments. Rather, the invention includes any new feature and any combination of features included in particular in any combination of features in the claims, even if this feature or this combination itself is not explicitly stated in the claims or exemplified embodiments.

The invention claimed is:

1. Optoelectronic semiconductor component, comprising:
a carrier having an upper side and a lower side opposite to the upper side;
at least one radiation-emitting semiconductor device which is disposed on the upper side and has a radiation emission surface, through which at least a portion of the electromagnetic radiation, which is generated during operation of the radiation emitting semiconductor device, leaves the radiation-emitting semiconductor device;
a radiation-absorbing layer which is arranged to absorb ambient light, which impinges upon the optoelectronic semiconductor component, such that an outer surface of the optoelectronic semiconductor component facing away from the carrier appears black at least in places; and
a radiation-reflecting layer which covers the lateral surfaces of the semiconductor device in places and which is disposed in a vertical direction between the carrier and the radiation-absorbing layer,
wherein the radiation-absorbing layer completely encircles the radiation-emitting semiconductor device in a lateral direction and is in direct contact, at least in places, with lateral surfaces of the radiation-emitting semiconductor device,
wherein the outer surface of the semiconductor component is formed at least in places by an outer surface of the radiation-absorbing layer, and
wherein the radiation emission surface is free from the radiation-absorbing layer.

2. The optoelectronic semiconductor component as claimed in claim 1, wherein the radiation-absorbing layer comprises a filler which, at least in places, encases the lateral surfaces of the radiation-emitting semiconductor device in a positive-locking manner.

3. The optoelectronic semiconductor component as claimed in claim 1, wherein the radiation-absorbing layer does not protrude beyond the radiation-emitting semiconductor device in a vertical direction.

4. The optoelectronic semiconductor component as claimed in claim 1, wherein a bond wire contacting the at least one radiation-emitting semiconductor device is covered at least partially by the radiation-absorbing layer.

* * * * *